(12) United States Patent
Hanawa et al.

(10) Patent No.: US 11,594,489 B2
(45) Date of Patent: Feb. 28, 2023

(54) SEMICONDUCTOR DEVICE AND METHOD OF MANUFACTURING THE SAME

(71) Applicant: Renesas Electronics Corporation, Tokyo (JP)

(72) Inventors: Toshikazu Hanawa, Ibaraki (JP); Kazuhide Fukaya, Ibaraki (JP); Makoto Koshimizu, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 455 days.

(21) Appl. No.: 16/668,802

(22) Filed: Oct. 30, 2019

(65) Prior Publication Data
US 2020/0066646 A1    Feb. 27, 2020

Related U.S. Application Data

(63) Continuation of application No. 15/640,042, filed on Jun. 30, 2017, now abandoned.

(30) Foreign Application Priority Data

Aug. 29, 2016 (JP) .................................. 2016-166580

(51) Int. Cl.
*H01L 23/532* (2006.01)
*H01L 21/768* (2006.01)
*H01L 23/522* (2006.01)

(52) U.S. Cl.
CPC .. H01L 23/53223 (2013.01); H01L 21/76802 (2013.01); H01L 21/76844 (2013.01);
(Continued)

(58) Field of Classification Search
CPC .......... H01L 29/4991; H01L 23/53223; H01L 23/53266; H01L 21/76846;
(Continued)

(56) References Cited

U.S. PATENT DOCUMENTS 6,191,027 B1   2/2001   Omura
6,245,659 B1   6/2001   Ushiyama
(Continued)

FOREIGN PATENT DOCUMENTS

JP   2000-188332 A   7/2000
JP   2001-085520 A   3/2001
(Continued)

OTHER PUBLICATIONS

Office Action dated Oct. 1, 2019, in Japanese Patent Application No. 2016-166580.
(Continued)

*Primary Examiner* — Latanya N Crawford Eason
(74) *Attorney, Agent, or Firm* — SGPatents PLLC

(57) ABSTRACT

An interlayer insulating film has via holes. A sidewall conductive layer is arranged along a sidewall surface of one via hole and contains one or more kinds selected from a group including tungsten, titanium, titanium nitride, tantalum and molybdenum. A second metal wiring layer is embedded in one via hole and contains aluminum. A plug layer is embedded in the other via hole and contains one or more kinds selected from the group including tungsten, titanium, titanium nitride, tantalum and molybdenum.

11 Claims, 16 Drawing Sheets

(52) U.S. Cl.
CPC .. *H01L 21/76846* (2013.01); *H01L 21/76877* (2013.01); *H01L 23/5226* (2013.01); *H01L 23/53266* (2013.01); *H01L 2924/13055* (2013.01)

(58) Field of Classification Search
CPC ......... H01L 21/76802; H01L 21/76877; H01L 21/76844; H01L 2924/1306; H01L 2924/13055
See application file for complete search history.

(56) References Cited

U.S. PATENT DOCUMENTS

| | | | |
|---|---|---|---|
| 6,300,683 B1* | 10/2001 | Nagasaka | H01L 27/10888 257/E23.152 |
| 10,163,644 B2* | 12/2018 | Lin | H01L 21/28556 |
| 2002/0111013 A1 | 8/2002 | Okada et al. | |
| 2003/0214043 A1 | 11/2003 | Saitoh et al. | |
| 2004/0222526 A1 | 11/2004 | Wada et al. | |
| 2005/0074966 A1 | 4/2005 | Rhodes | |
| 2005/0145899 A1 | 7/2005 | Fujii | |
| 2008/0116576 A1 | 5/2008 | Moon et al. | |
| 2011/0254165 A1 | 10/2011 | Muranaka | |
| 2013/0207276 A1 | 8/2013 | Tseng et al. | |
| 2013/0323919 A1 | 12/2013 | Teo et al. | |
| 2014/0138845 A1 | 5/2014 | Kulkarni et al. | |
| 2016/0035623 A1* | 2/2016 | Shao | H01L 21/76879 257/774 |
| 2016/0126135 A1 | 5/2016 | Zhang et al. | |
| 2016/0141179 A1 | 5/2016 | Wu et al. | |

FOREIGN PATENT DOCUMENTS

| | | |
|---|---|---|
| JP | 2002-313913 A | 10/2002 |
| JP | 2003-318395 A | 11/2003 |
| JP | 2007-227970 A | 9/2007 |

OTHER PUBLICATIONS

Office Action dated Aug. 4, 2020, in Taiwanese Patent Application No. 106127520.

Office Action dated Oct. 30, 2020, in Taiwanese Patent Application No. 106127520.

Office Action dated Sep. 27, 2022, in Chinese Patent Application No. 201710668355.1.

* cited by examiner

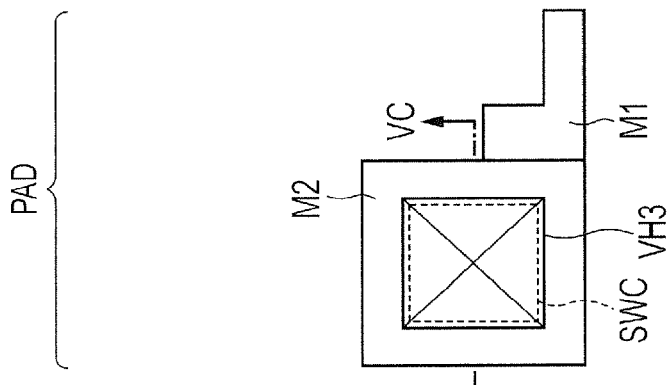
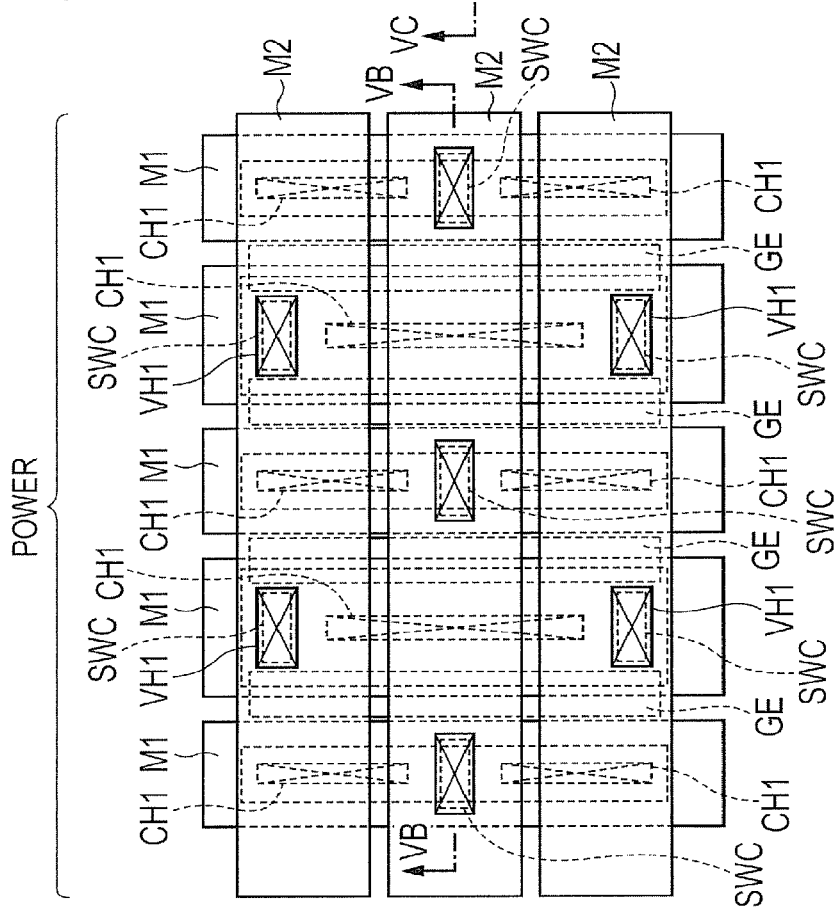
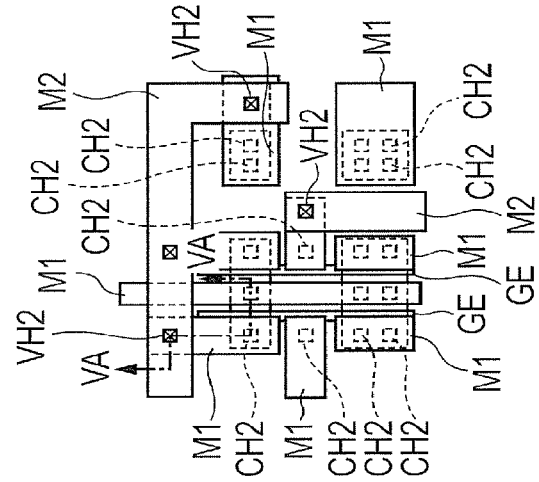

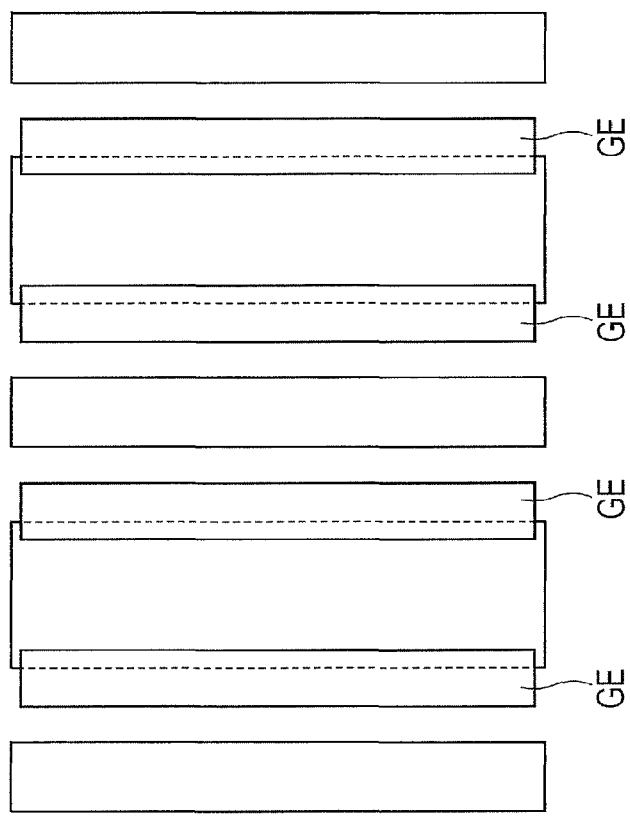
FIG. 3B
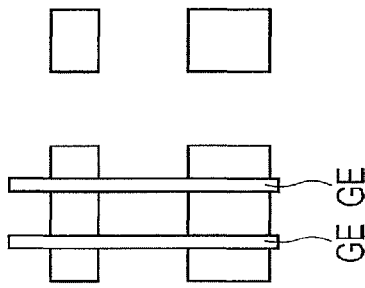
FIG. 3A

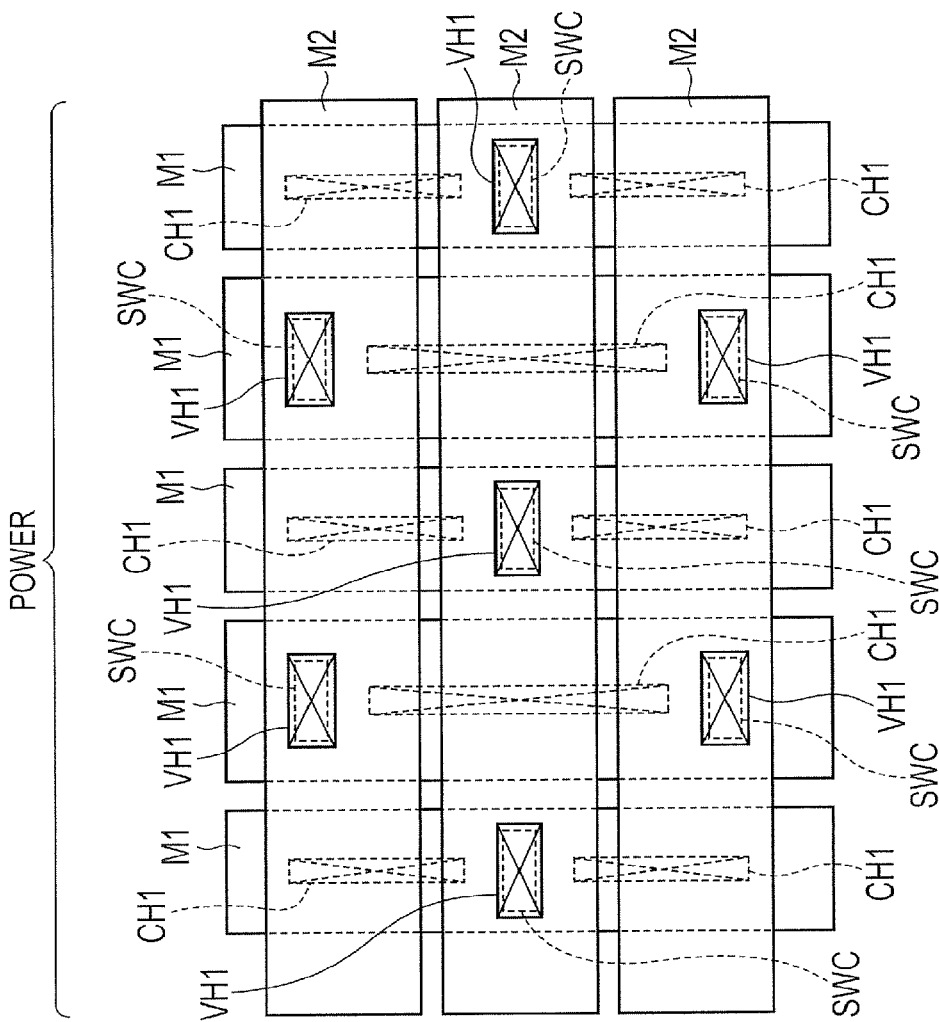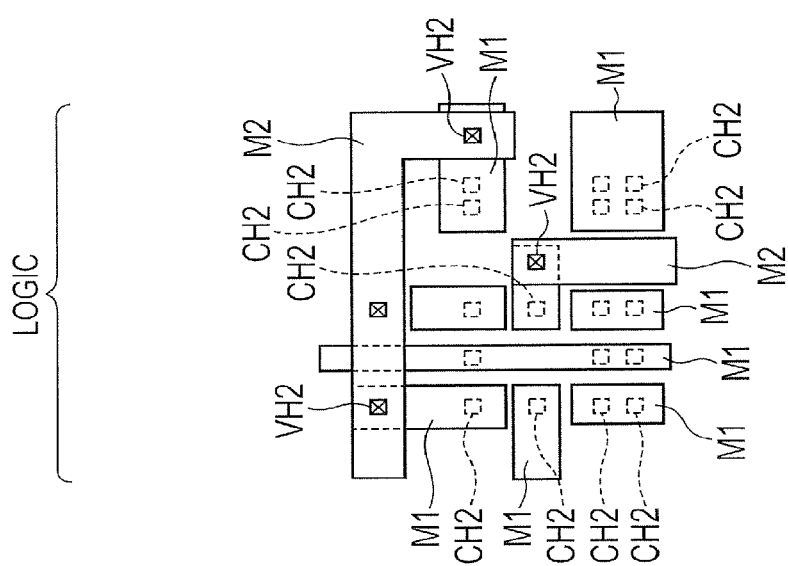

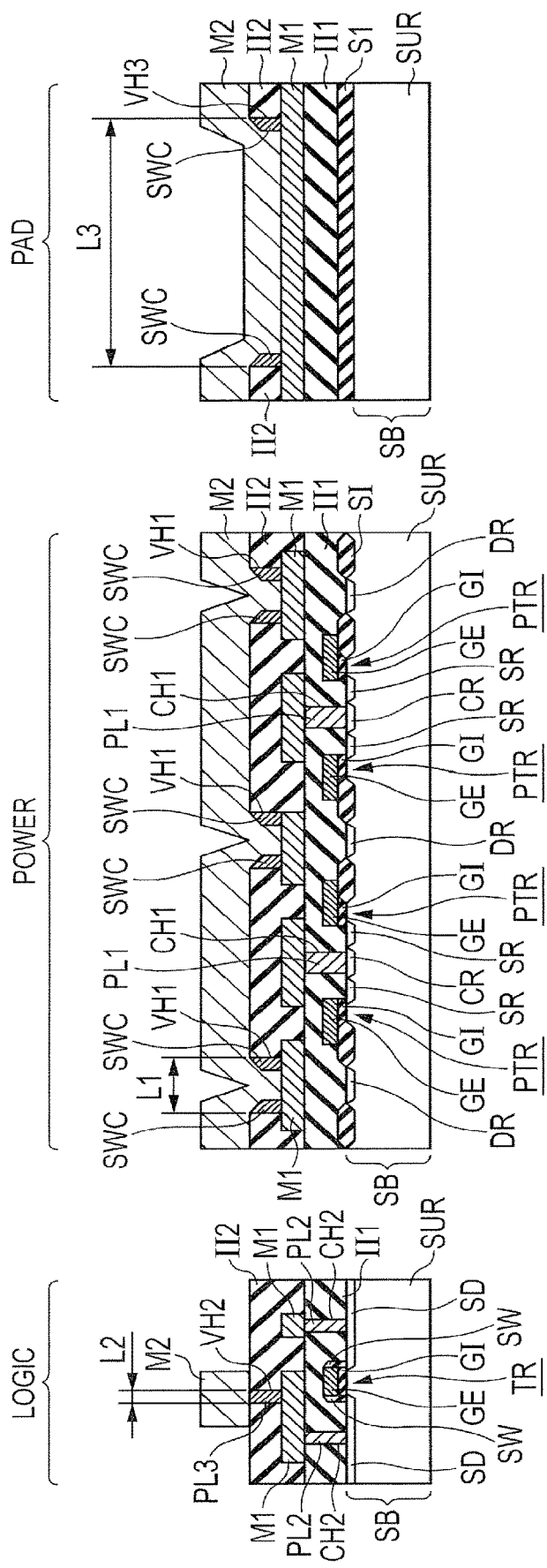

EQUIVALENT CIRCUIT

SEMICONDUCTOR DEVICE AND METHOD OF MANUFACTURING THE SAME

CROSS-REFERENCE TO RELATED APPLICATIONS

The disclosure of Japanese Patent Application No. 2016-166580 filed on Aug. 29, 2016 including the specification, drawings and abstract is incorporated herein by reference in its entirety.

BACKGROUND

The present invention relates to a semiconductor device and a method of manufacturing the semiconductor device.

Internal structures of a contact hole and a via hole in the semiconductor device are disclosed, for example, in Japanese Unexamined Patent Application Publication Nos. 2001-85520 and 2002-313913.

In Japanese Unexamined Patent Application Publication No. 2001-85520, a sidewall which is made of tungsten is formed in the via hole and thereafter another tungsten is embedded in the via hole. Thereby, a contact plug which is configured by two tungsten layers is formed.

In addition, in Japanese Unexamined Patent Application Publication No. 2002-313913, tungsten and polycrystalline silicone are embedded in the via hole and thereby the contact plug is formed.

SUMMARY

In Japanese Unexamined Patent Application Publication No. 2001-85520, since the contact hole is made of only tungsten, the resistance in the contact hole is increased. Therefore, the configuration of this contact plug is not suited for a power system circuit unit to which adaptability to large current and resistance reduction are requested.

In addition, in Japanese Unexamined Patent Application Publication No. 2002-313913, the contact plug contains polycrystalline silicone. Since polycrystalline silicon is high in resistance, the configuration of this contact plug is not suited for the power system circuit part to which the adaptability to large current and the resistance reduction are requested. When aluminum is used in place of polycrystalline silicon, coatability of the via hole is worsened.

Other matters to be solved and novel features of the preset invention will become apparent from the description of the present specification and the appended drawings.

The present invention has been made in view of the above mentioned circumstances. According to one embodiment of the present invention, there is provided a semiconductor device in which an insulating film has a first through-hole and a second through-hole, a first conductive film has a first sidewall part arranged along a sidewall surface of the first through-hole and contains one or more kinds selected from a group including tungsten, titanium, titanium nitride, tantalum and molybdenum, a second conductive film is embedded in the first through-hole and contains aluminum and a third conductive film is embedded in the second through-hole and contains one or more kinds selected from the group including tungsten, titanium, titanium nitride, tantalum and molybdenum.

According to the above-mentioned one embodiment of the present invention, it is possible to realize the semiconductor device which has an internal configuration of the through-hole which is suited for the power system circuit unit and a method of manufacturing the semiconductor device.

BRIEF DESCRIPTION OF THE DRAWINGS

FIG. 2A is a plan view illustrating one configurational example of the semiconductor device according to the first embodiment.

FIG. 2B is a plan view illustrating one configurational example of the semiconductor device according to the first embodiment.

FIG. 2C is a plan view illustrating one configurational example of the semiconductor device according to the first embodiment.

FIG. 3A is a plan view illustrating one example of the lower layer side of the plan view in FIG. 2.

FIG. 3B is a plan view illustrating one example of the lower layer side of the plan view in FIG. 2.

FIG. 4A is a plan view illustrating one example of the upper layer side of the plan view in FIG. 2.

FIG. 4B is a plan view illustrating one example of the upper layer side of the plan view in FIG. 2.

FIG. 5A is a sectional diagram along the VA-VA line in FIG. 2A, illustrating one configurational example of the semiconductor device according to the first embodiment.

FIG. 5B is a sectional diagram along the VB-VB line in FIG. 2A, illustrating one configurational example of the semiconductor device according to the first embodiment.

FIG. 5C is a sectional diagram along the VC-VC line in FIG. 2A, illustrating one configurational example of the semiconductor device according to the first embodiment.

DETAILED DESCRIPTION

In the following, preferred embodiments of the present invention will be described with reference to the accompanying drawings.

First Embodiment

Figure 1:
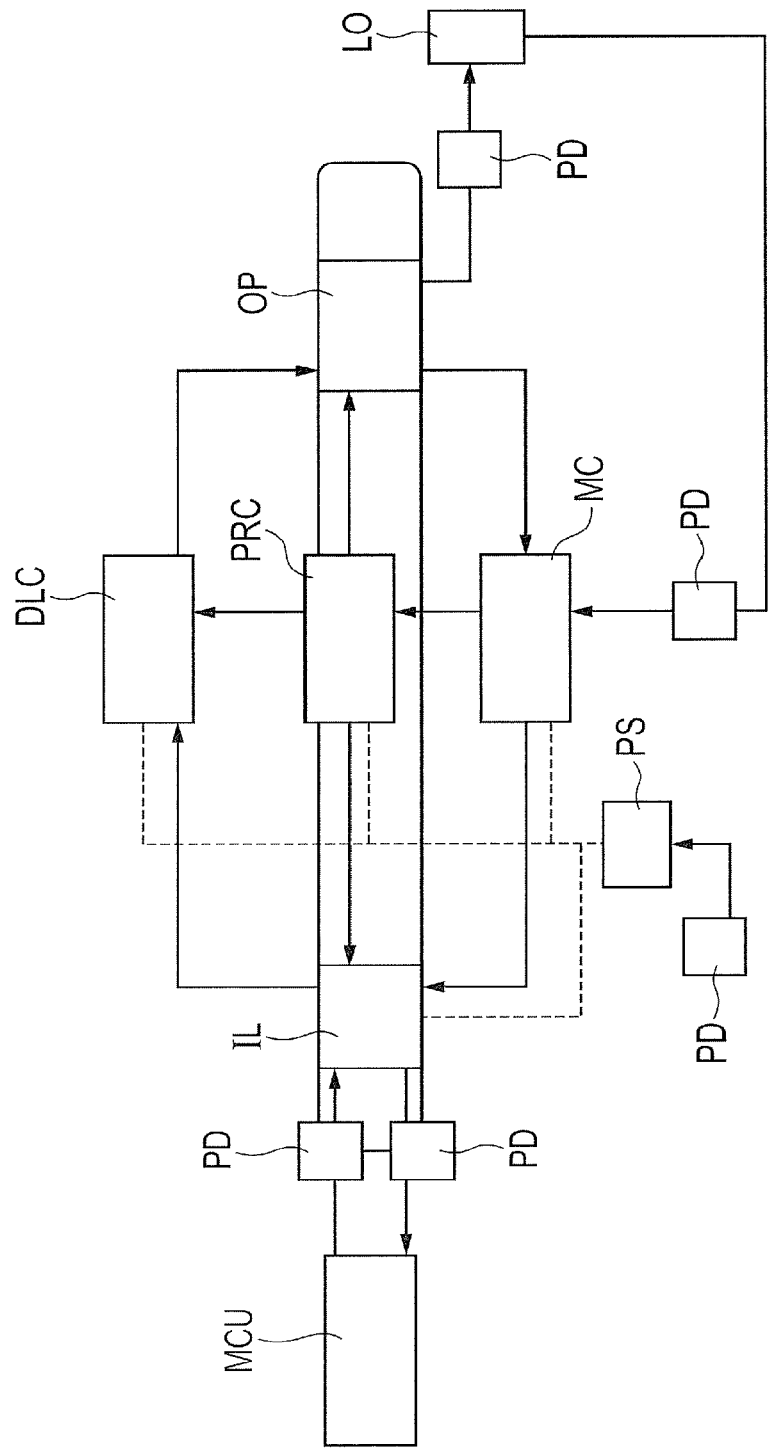
FIG. 1 is a block diagram illustrating one functional example of a semiconductor device according to a first embodiment.

As illustrated in FIG. 1, a semiconductor device according to the first embodiment mainly includes an output power element unit OP, an interface/logic circuit IL, a monitor circuit MC, a protection circuit PRC, a driving logic circuit DLC, a power source PS and a plurality of pads PD.

The power source PS receives power supply from the outside via the pad PD concerned. The power source PS is capable of supplying the power which has been received from the outside to the interface/logic circuit IL, the monitor circuit MC, the protection circuit PRC and the driving logic circuit DLC.

The interface/logic circuit IL is electrically coupled with an external MCU (Micro Controller Unit) via the pads PD concerned. Thereby, it becomes possible for the interface/logic circuit IL to input and output a signal from and to the MCU.

The MCU is an SOC (System on Chip). The interface/logic circuit IL is capable of inputting signals which have been respectively output from the monitor circuit MC and the protection circuit PRC and is capable of outputting a signal to the driving logic circuit DLC.

A load LO is electrically coupled between the output power element unit OP and the monitor circuit MC via the pads PD concerned. The output power element unit OP is capable of controlling the load LO by outputting a signal to the load LO via the pad PD concerned. A signal from the load LO is fed back to the monitor circuit MC via the pad PD concerned. The output power element unit OP is capable of inputting signals which have been respectively output from the protection circuit PRC and the driving logic circuit DLC and is capable of outputting a signal to the monitor circuit MC.

The monitor circuit MC is capable of outputting a signal to the protection circuit PRC and is capable of outputting a signal to the driving logic circuit DLC.

FIG. 2A illustrates one example of a planar structure of part of the interface/logic circuit IL illustrated in FIG. 1. FIG. 2B illustrates one example of a planar structure of part of the output power element unit OP illustrated in FIG. 1. FIG. 2C illustrates one example of a planar structure of the pad PD illustrated in FIG. 1.

FIG. 3A is a plan view of the lower layer side of the interface/logic circuit IL in FIG. 2A and FIG. 3B is a plan view of the lower layer side of the output power element unit PO in FIG. 2B. In addition, FIG. 4A is a plan view of the upper layer side of the interface/logic circuit IL in FIG. 2A and FIG. 4B is a plan view of the upper layer side of the output power element unit OP in FIG. 2B.

FIG. 5A is a sectional diagram along the VA-VA line in FIG. 2A, FIG. 5B is a sectional diagram along the VB-VB line in FIG. 2B and FIG. 5C is a sectional diagram along the VC-VC line in FIG. 2C.

As illustrated mainly in FIG. 5A, in a logic section, a MOS (Metal Oxide Semiconductor) transistor TR is formed on/over a surface of a semiconductor substrate SB. The MOS transistor TR includes one pair of source/drain regions SD, a gate insulating film GI, a gate electrode GE and so forth.

One pair of the source/drain regions SD are formed on/over the surface of the semiconductor substrate SB apart from each other by leaving a distance between them. The gate electrode GE is formed on/over the surface of the semiconductor substrate SB with the gate insulating film GI being interposed so as to face a region which is sandwiched between one pair of the source/drain regions SD.

As illustrated mainly in FIG. 2A and FIG. 5A, the MOS transistor TR is formed on a crossing part between the gate electrode GE and an active region of the semiconductor substrate SB in a planar view. Here, the planar view means a viewpoint viewed from a direction vertical to the surface of the semiconductor substrate SB.

As illustrated mainly in FIG. 5A, an interlayer insulating film II1 is formed on/over the surface of the semiconductor substrate SB so as to cover the MOS transistor TR. A plurality of contact holes CH2 are formed in the interlayer insulating film II1. The contact holes CH2 reach the respective source/drain regions SD so paired. A plug layer PL2 is embedded in each contact hole CH2.

A first metal wiring layer M1 is formed on/over an upper surface of the interlayer insulating film II1 so as to be electrically coupled to the source/drain regions SD via the plug layer PL2. The first metal wiring layer M1 is made of a material which contains, for example, aluminum (Al). Specifically, the first metal wiring layer M1 is made of the material such as, for example, aluminum, an aluminum-copper alloy and so forth.

An interlayer insulating film II2 (an insulating film) is formed on/over the interlayer insulating film II1 so as to cover over the first metal wiring layer M1. The interlayer insulating film II2 is configured by, for example, a silicon oxide film. The silicon oxide film is formed by, for example, a plasma CVD method using TEOS (Tetra Ethyl Ortho Silicate) which is one kind of organic silicon compounds.

A plurality of via holes VH2 (second through-holes) are formed in the interlayer insulating film II2. The via holes VH2 reach the first metal wiring layer M1. A plug layer PL3 (a third conductive film) is embedded in each via hole VH2.

The plug layer PL3 is configured by a metal film (for example, a high-melting point metal film) formation of which is possible by using, for example, a CVD (Chemical Vapor Deposition) method. Specifically, the plug layer PL3 is made of a material which contains, for example, one or more kinds selected from a group including tungsten (W), titanium (Ti), titanium nitride (TiN), a tantalum (Ta) and molybdenum (Mb).

A second metal wiring layer M2 is formed on/over an upper surface of the interlayer insulating film II2 so as to be electrically coupled with the first metal wiring layer M1 via the plug layer PL3. The second metal wiring layer M2 is made of the material which contains, for example, aluminum. Specifically, the second metal wiring layer M2 is made of the material such as aluminum, the aluminum-copper alloy and so forth.

As illustrated mainly in FIG. 2A and FIG. 4A, the contact hole CH2 is formed in a crossing part between the first metal wiring layer M1 and the active region of the semiconductor substrate SB in the planar view. In addition, the via hole VH2 is formed in a crossing point between the first metal wiring layer M1 and the second metal wiring layer M2 in the planer view.

As illustrated mainly in FIG. 5B, in a power element section, a power MOS transistor PTR is formed on/over the surface of the semiconductor substrate SB. The power MOS transistor PTR includes a source region SR, a drain region DR, the gate insulating film, the gate electrode GE and so forth.

The source region SR and the drain region DR are formed on/over the surface of the semiconductor substrate SB apart from each other by leaving a distance between them. An element isolation insulating film SI is formed on/over the surface of the semiconductor substrate SB between the source region SR and the drain region DR. The element isolation insulating film SI is configured by, for example, a silicon oxide film which has been formed by a LOCOS (LOCal Oxidation of Silicon) method.

The gate electrode GE is formed on/over the surface of the semiconductor substrate SB with the gate insulating film GI being interposed so as to face a region which is sandwiched between the source region SR and the drain region DR. An end on the drain region DR side of the gate electrode GE rides on the element isolation insulating film SI. In addition, a contact region CR is formed on/over the surface of the semiconductor substrate SB so as to be adjacent to the source region SR.

As illustrated mainly in FIG. 2B and FIG. 3B, the gate electrode GE extends so as to be arranged side by side with the active region of the semiconductor substrate SB in the planer view.

As illustrated mainly in FIG. 5B, the interlayer insulating film II1 is formed on/over the surface of the semiconductor substrate SB so as to cover the power MOS transistor PTR. The interlayer insulating film II1 is made of the same material as the interlayer insulating film II1 in the logic section. A plurality of contact holes CH1 are formed in the interlayer insulating film II1. The contact holes CH1 reach the contact region CR and the source region SR. A plug layer PL1 id embedded in each contact hole CH1.

The first metal wiring layer M1 is formed on/over the upper surface of the interlayer insulating film II1 so as to be electrically coupled to the contact region CR and the source region SR via the plug layer PL1. The first metal wiring layer M1 is made of the material which contains, for example, aluminum. Specifically, the first metal wiring layer M1 is made of the material such as, for example, aluminum, the aluminum-copper alloy and so forth.

The interlayer insulating film II2 is formed on/over the interlayer insulating film II1 so as to cover over the first metal wiring layer M1. The interlayer insulating film II2 is configured by, for example, the silicon oxide film. The silicon oxide film is formed by, for example, the plasma CVD method using TEOS which is one kind of the organic silicon compounds.

A plurality of via holes VH1 (first through-holes) are formed in the interlayer insulating film II2. The via holes VH1 reach the first metal wiring layer M1. A width L1 of each via hole VH1 is wider than a width L2 of each via hole VH2 in the logic section.

A sidewall spacer shaped sidewall conductive layer SWC (a first conductive film) is formed so as to be arranged along a sidewall surface of each via hole VH1. The sidewall conductive layer SWC is made of the material which contains, for example, one or more kinds selected from the group including tungsten, titanium, titanium nitride, tantalum and molybdenum. In each via hole VH1, an upper surface of the first metal wiring layer M1 is exposed from the sidewall conductive layer SWC.

The second metal wiring layer M2 (a second conductive film) is formed so as to be embedded in the via hole VH1 and to be located on/over the upper surface of the interlayer insulating film II2. The second metal wiring layer M2 is made of the material which contains, for example, aluminum. Specifically, the second metal wiring layer M2 is made of the material such as, for example, aluminum, the aluminum-copper alloy and so forth.

The second metal wiring layer M2 is in contact with an upper surface of the first metal wiring layer M1 on the bottom part of each via hole VH1. In addition, the second metal wiring layer M2 is in contact with a side surface of the sidewall conductive layer SWC in each via hole VH1.

As illustrated mainly in FIG. 2B and FIG. 4B, the first metal wiring layer M1 extends so as to be arranged side by side with the gate electrode GE in the planar view. The second metal wiring layer M2 extends in a direction intersecting with (for example, a direction orthogonal to) the first metal wiring layer M1 in the planar view.

The contact hole CH1 is formed in a crossing part between the first metal wiring layer M1 and the active region of the semiconductor substrate SB in the planar view. In addition, the via hole VH1 is formed in a crossing part between the first metal wiring layer M1 and the second metal wiring layer M2 in the planar view. The sidewall conductive layer SWC is annularly formed along the sidewall surface of each via hole VH1 in the planar view.

As illustrated in FIG. 2C and FIG. 5C, in a pad section, the element isolation insulating film SI is formed on/over the surface of the semiconductor substrate SB. The interlayer insulating film ill is formed on/over the interlayer insulating film II1. The interlayer insulating film II1 is made of the same material as the interlayer insulating film II1 in the logic section.

The first metal wiring layer M1 is formed on/over the interlayer insulating film II1. The first metal wiring layer M1 is made of the material which contains, for example, aluminum. Specifically, the first metal wiring layer M1 is made of the material such as, for example, aluminum, the aluminum-copper alloy and so forth.

The interlayer insulating film II2 is formed on/over the interlayer insulating film II1 so as to cover the first metal wiring layer M1. The interlayer insulating film 112 is configured by, for example, the silicon oxide film. The silicon oxide film is formed by, for example, the plasma CVD method using TEOS which is one kind of the organic silicon compounds.

A via hole VH3 is formed in the interlayer insulating film II2. The via hole VH3 reaches the first metal wiring layer M1. A width L3 of the via hole VH3 is wider than the width L1 of each via hole in the power element section.

The sidewall spacer shaped sidewall conductive layer SWC is formed so as to be arranged along a sidewall surface of the via hole VH3. The sidewall conductive layer SWC is made of the material which contains, for example, one or more kinds selected from the group including tungsten, titanium, titanium nitride, tantalum and molybdenum. In the via hole VH3, the upper surface of the first metal wiring layer M1 is exposed from the sidewall conducive layer SWC. The sidewall conductive layer SWC is formed annularly along the sidewall surface of the via hole VH3 in the planar view.

The second metal wiring layer M2 is formed so as to be embedded in the via hole VH3 and to be located on/over the upper surface of the interlayer insulating film II2. The second metal wiring layer M2 is made of, for example, the material which contains aluminum (Al). Specifically, the second metal wiring layer M2 is made of the material such as, for example, aluminum, the aluminum-copper alloy and so forth.

The second metal wiring layer M2 is in contact with the upper surface of the first metal wiring layer M1 on the bottom part of the via hole VH3. In addition, the second metal wiring layer M2 is in contact with a side surface of the sidewall conductive layer SWC in the via hole VH3. When a barrier metal layer (not illustrated) is formed on/over the upper surface of the first metal wiring layer M1, the second metal wiring layer M2 may be formed so as to be in contact with an upper surface of the barrier metal layer in the via hole VH1.

Incidentally, in each of the logic section, the power element section and the pad section, a first barrier metal layer (not illustrated) may be formed so as to cover the upper surface and the side surfaces of the first metal wiring layer M1. In addition, a second barrier metal layer (not illustrated) may be formed so as to cover the upper surface of the interlayer insulating film 112 and side surfaces and bottom surfaces of the respective via holes VH1 to VH3.

Then, a method of manufacturing the semiconductor device according to the first embodiment will be described by using FIG. 6 to FIG. 10. Incidentally, in the following description on the manufacturing method, upper-layer parts which are located higher than the first metal wiring layer M1 will be described.

Figure 6A:
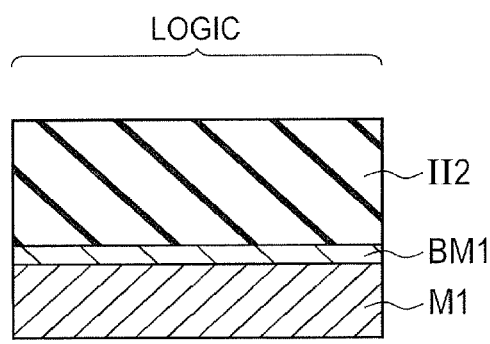
FIG. 6A is a schematic sectional diagram illustrating one example of a first process of a method of manufacturing the semiconductor device according to the first embodiment.
Figure 6B:
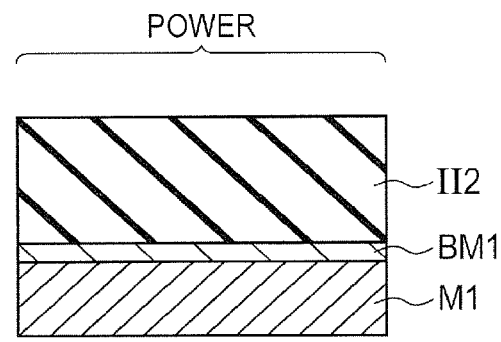
FIG. 6B is a schematic sectional diagram illustrating one example of the first process of the method of manufacturing the semiconductor device according to the first embodiment.

As illustrated in FIG. 6A and FIG. 6B, the first metal wiring layer M1 is formed on/over the interlayer insulating film II1 (not illustrated). The first metal wiring layer M1 is formed by, for example, depositing an aluminum layer by sputtering and thereafter patterning the aluminum layer by general photolithography technology and etching technology. A first barrier metal layer BM1 is formed so as to cover the upper surface and the side surfaces of the first metal wiring layer M1. The first barrier metal layer BM1 is made of, for example, titanium nitride (TiN).

The interlayer insulating film II2 which is configured by, for example, a silicon oxide film is formed on/over the interlayer insulating film II1 so as to cover the first metal wiring layer M1. The interlayer insulating film II1 is formed by, for example, the plasma CVD method using TEOS which is one kind of the organic silicon compounds.

Figure 7A:
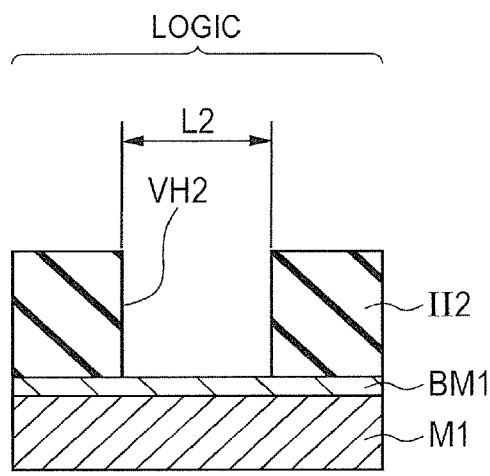
FIG. 7A is a schematic sectional diagram illustrating one example of a second process of the method of manufacturing the semiconductor device according to the first embodiment.
Figure 7B:
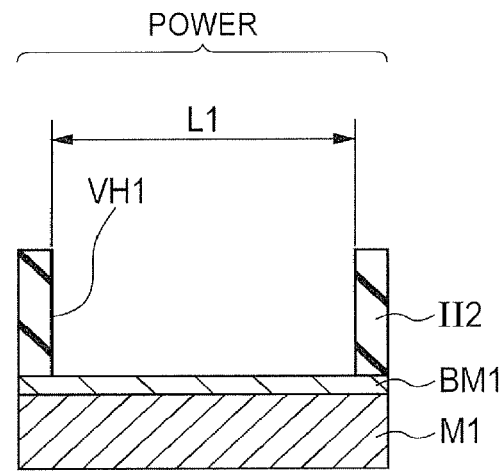
FIG. 7B is a schematic sectional diagram illustrating one example of the second process of the method of manufacturing the semiconductor device according to the first embodiment.

As illustrated in FIG. 7A and FIG. 7B, the via holes VH1 and VH2 are formed in the interlayer insulating film II2 by the general photolithography technology and etching technology. The respective via holes VH1 and VH2 are formed so as to reach the first metal wiring layer M1. When the first barrier metal layer BM1 is formed on/over the upper surface of the first metal wiring layer M1 as in the first embodiment, the respective via holes VH1 and VH2 are formed so as to reach the first barrier metal layer BM1. The via hole VH1 which is to be formed in the power element section is formed so as the have the width L1 which is wider than the width L2 of the via hole VH2 which is to be formed in the logic section.

Figure 8A:
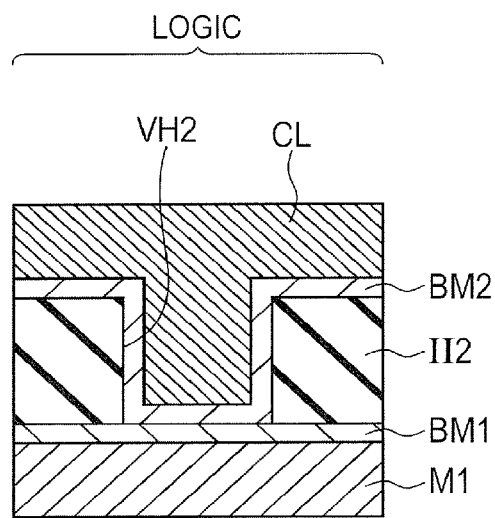
FIG. 8A is a schematic sectional diagram illustrating one example of a third process of the method of manufacturing the semiconductor device according to the first embodiment.
Figure 8B:
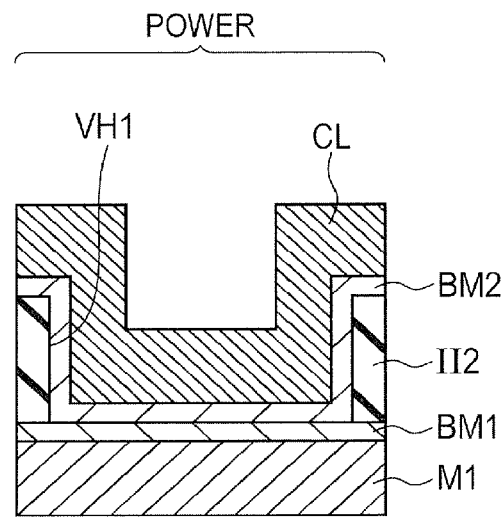
FIG. 8B is a schematic sectional diagram illustrating one example of the third process of the method of manufacturing the semiconductor device according to the first embodiment.

As illustrated in FIG. 8A and FIG. 8B, a second barrier metal layer BM2 is formed so as to cover the upper surface of the interlayer insulating film II2 and inner wall surfaces (sidewall surfaces and bottom wall surfaces) of the via holes VH1 and VH2. The second barrier metal layer BM2 is formed by, for example, laminating in order titanium and titanium nitride from below. Each of titanium and titanium nitride which configure the second barrier metal BM2 is formed by, for example, sputtering.

A conductive layer CL is formed on/over the second barrier metal layer BM2. The conductive layer CL is formed by, for example, depositing tungsten by the CVD method. In this case, in the power element section, the conducive layer CL is not tightly embedded in the via hole VH1 and is formed along inner wall surfaces (the sidewall surface and the bottom wall surface) of the via hole VH1. On the other hand, in the logic section, the conductive layer CL is formed so as to be tightly embedded in the via hole VH2.

Figure 9A:
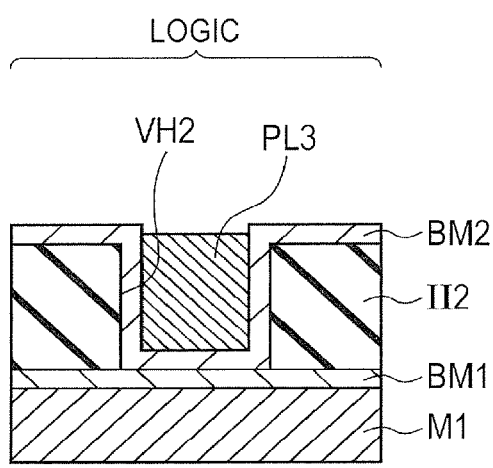
FIG. 9A is a schematic sectional diagram illustrating one example of a fourth process of the method of manufacturing the semiconductor device according to the first embodiment.
Figure 9B:
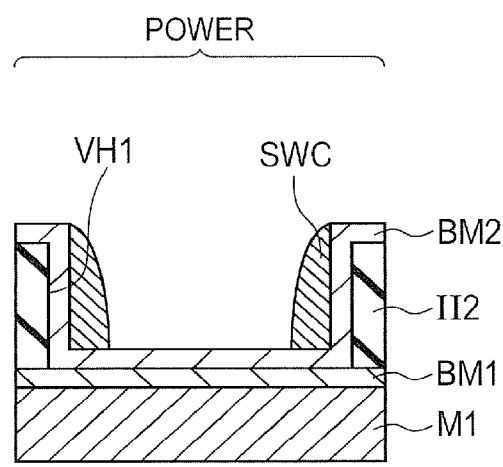
FIG. 9B is a schematic sectional diagram illustrating one example of the fourth process of the method of manufacturing the semiconductor device according to the first embodiment.

As illustrated in FIG. 9A and FIG. 9B, etching-back is performed on the entire surface of the conductive layer CL. The etching-back is performed until the bottom wall surface of the via hole VH1 is exposed. Specifically, the etching-back is performed until, for example, the second barrier metal layer BM2 is exposed from the conductive layer CL.

In the power element section, the conductive layer CL is left in the form of a sidewall spacer shape so as to cover the sidewall of the via hole VH1 by the etching-back. Thereby, the sidewall spacer shaped sidewall conductive film SWC is formed from the conductive layer CL. Therefore, the second barrier metal layer BM2 is exposed from the sidewall conductive layer SWC on the bottom wall surface of the via hole VH1.

On the other hand, in the logic section, the conductive layer CL is left in a state of being embedded in the via hole VH2 by the etching-back. Thereby, the plug layer PL3 which is embedded in the via hole VH2 is formed from the conductive layer CL. Therefore, the second barrier metal layer BM2 is not exposed from the plug layer PL3 on the bottom wall surface of the via hole VH2.

Figure 10A:
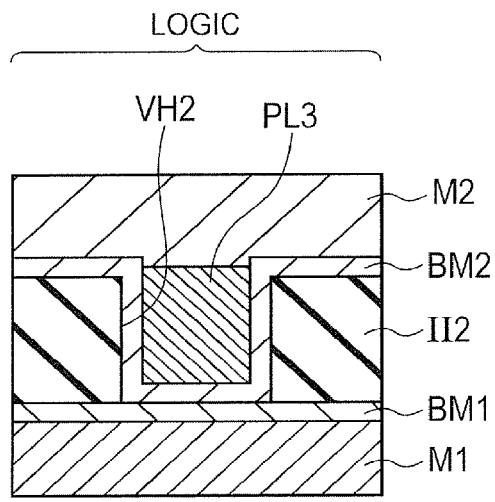
FIG. 10A is a schematic sectional diagram illustrating one example of a fifth process of the method of manufacturing the semiconductor device according to the first embodiment.
Figure 10B:
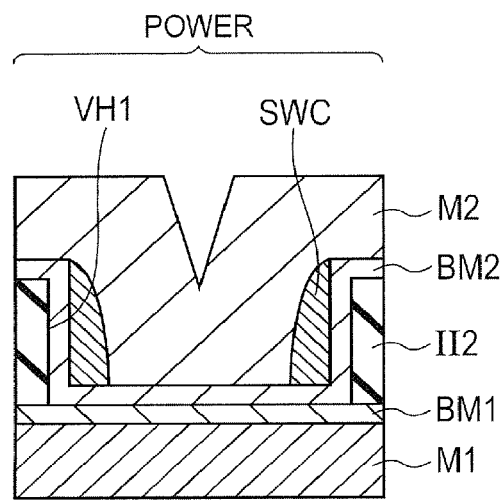
FIG. 10B is a schematic sectional diagram illustrating one example of the fifth process of the method of manufacturing the semiconductor device according to the first embodiment.

As illustrated in FIG. 10A and FIG. 10B, the second metal wiring layer M2 is formed on/over the interlayer insulating film II2. The second metal wiring layer M2 is formed by, for example, depositing an aluminum layer by sputtering and thereafter patterning the aluminum layer by the general photolithography technology and etching technology.

From the foregoing, the semiconductor device according to the first embodiment illustrated in FIG. 2 to FIG. 5 is manufactured.

Then, operational advantages of the first embodiment will be described in comparison with a comparative example illustrated in FIG. 11 to FIG. 13.

Figure 11:
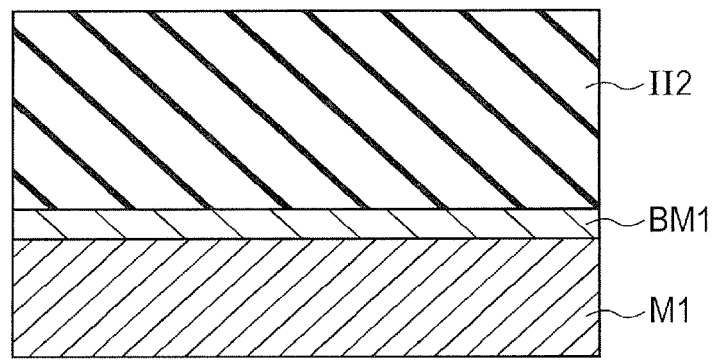
FIG. 11 is a schematic sectional diagram illustrating one example of a first process of a method of manufacturing a semiconductor device according to a comparative example.

As illustrated in FIG. 11, also in the comparative example, the first metal wiring layer M1, the first barrier metal layer BM1 and the interlayer insulating film II2 are formed on/over the interlayer insulating film II1 (not illustrated) in the same manner as that illustrated in FIG. 6A and FIG. 6B.

Figure 12:
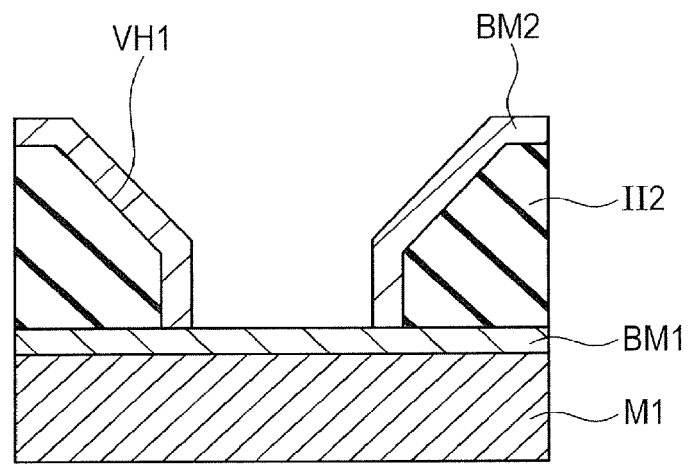
FIG. 12 is a schematic sectional diagram illustrating one example of a second process of the method of manufacturing the semiconductor device according to the comparative example.

As illustrated in FIG. 12, in the comparative example, then, the via hole VH1 is formed in the interlayer insulating film II2. The via hole VH1 is formed by selectively wet-etching the upper surface of the interlayer insulating film II2 down to a predetermined depth and thereafter dry-etching the upper surface of the interlayer insulating film II2. Then, the second barrier metal layer BM2 is formed in the same manner as that in the first embodiment.

Figure 13:
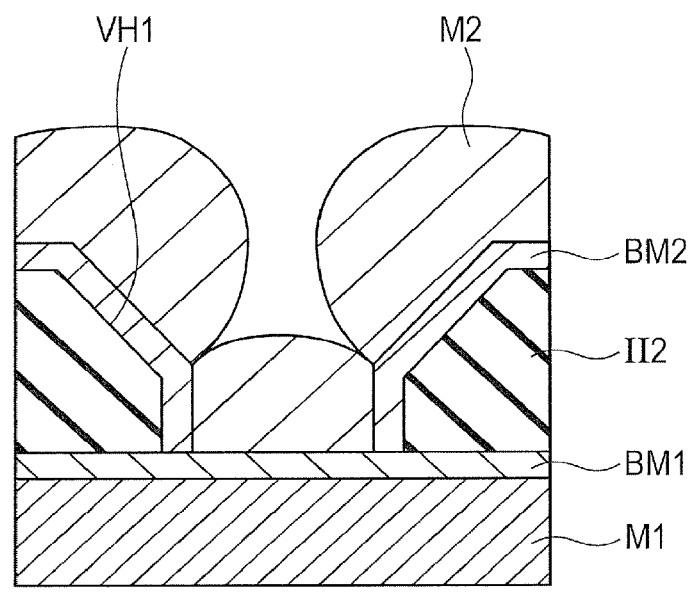
FIG. 13 is a schematic sectional diagram illustrating one example of a third process of the method of manufacturing the semiconductor device according to the comparative example.

As illustrated in FIG. 13, an aluminum film is formed by sputtering as the second metal wiring layer M2.

In the above-mentioned comparative example, an upper end of the via hole VH1 is widened by wet-etching. Thereby, the coatability of the aluminum film M2 which is low in coatability is improved. However, the coatability of the aluminum film M2 is basically low and a part which is thin in film thickness is formed on the aluminum film M2 in the vicinity of the bottom part of the via hole VH1 as illustrated in FIG. 13. Therefore, when a large current flows, it is feared that resistance to electro-migration may be deteriorated.

On the other hand, in the first embodiment, as illustrated in FIG. 10B, the sidewall conductive layer SWC is formed on the sidewall of the via hole VH1. Accordingly, even when the part which is thin in film thickness is formed on the second metal wiring layer M2 on the bottom part of the via hole VH1, it is possible to ensure the whole film thickness (the sum total of film thicknesses of the sidewall conductive layer SWC and the second metal wiring layer M2) of the conductive layer by the sidewall conductive layer SWC. Accordingly, even when the large current flows, it is possible to more improve the resistance to electro-migration than the comparative example.

In addition, in the first embodiment, as illustrated in FIG. 10B, the sidewall conductive layer SWC is made of the material which contains, for example, one or more kinds selected from the group including tungsten, titanium, titanium nitride, tantalum and molybdenum. The above-mentioned material is the metal film (for example, the high-melting point metal film) formation of which is possible by the CVD method and is the material which is high in coatability in film-deposition. Therefore, it is possible to securely coat the sidewall conductive layer SWC down to the bottom part of the via hole VH1 by forming the sidewall conductive layer SWC by using this material.

In addition, the diameter of the via hole VH1 is more smoothly increased as it goes upward by forming the sidewall conducive layer SWC on the sidewall of the via hole VH1. Therefore, the coatability of the second metal wiring layer M2 which is configured by the aluminum film in the via hole VH1 becomes preferable and it becomes possible to promote resistance reduction of the second metal wiring layer M2.

In addition, the aluminum film is a low-resistance material and that low-resistance material is embedded in the via hole VH1. Accordingly, it becomes possible for the above-mentioned configuration to more promote the resistance reduction than a configuration that only tungsten is embedded in the via hole VH1 and a configuration that polycrystalline silicon is embedded in the via hole VH1.

From the foregoing, in the first embodiment, it becomes possible to simultaneously attain the adaptability to large current and the resistance reduction which are requested in the power system circuit unit.

In addition, in the first embodiment, the plug layer PL3 is embedded in the via hole VH2 of the logic section. The plug layer PL3 is formed from the conductive layer CL which is the same as the sidewall conductive layer SWC in material. Accordingly, it is possible to perform embedding of the plug layer PL3 in the via hole VH2 in the logic section simultaneously with formation of the sidewall conductive layer SWC on the sidewall of the via hole VH1 in the power element section. Thereby it becomes possible to promote simplification of a manufacturing process.

In addition, in order to individually form the plug layer PL3 and the sidewall conductive layer SWC in manufacturing processes which are performed simultaneously, it is requested to make the width L2 of the via hole VH2 narrower than the width L1 of the via hole VH1. Since in the first embodiment it is possible to narrow the width L2 of the via hole VH2 in this way, it is also easy to cope with high integration of the elements in the logic section.

In addition, in the first embodiment, as illustrated in FIG. 10B, part (part of the second barrier metal layer BM2) of the bottom wall surface of the via hole VH1 is exposed from the sidewall conductive layer SWC. Therefore, it becomes possible to largely secure an occupation region of the second metal wiring layer M2 in the via hole VH1. Since the second metal wiring layer M2 contains low-resistance aluminum, it becomes possible to promote further resistance reduction by largely securing the occupation region of the second metal wiring layer M2 in the via hole VH1.

In addition, in the first embodiment, as illustrated in FIG. 2 to FIG. 5, the via hole VH1 is arranged directly above a region where a power element (for example, the power MOS transistor PTR) is formed. Thereby, it becomes easy to electrically couple the first metal wiring layer M1 which is electrically coupled to the source region SR or the drain region DR of the power MOS transistor PTR to the second metal wiring layer M2 via the via hole VH1.

In addition, in the first embodiment, as illustrated in FIG. 2 to FIG. 5, the via hole VH2 is arranged directly above a region where a logic element (for example, the MOS transistor TR) is formed. Thereby, it becomes easy to electrically couple the first metal wiring layer M1 which is electrically coupled to one of the pair of source/drain regions SD or to the gate electrode GE of the MOS transistor TR to the second metal wiring layer M2 via the via hole VH2.

Second Embodiment

Figure 14:
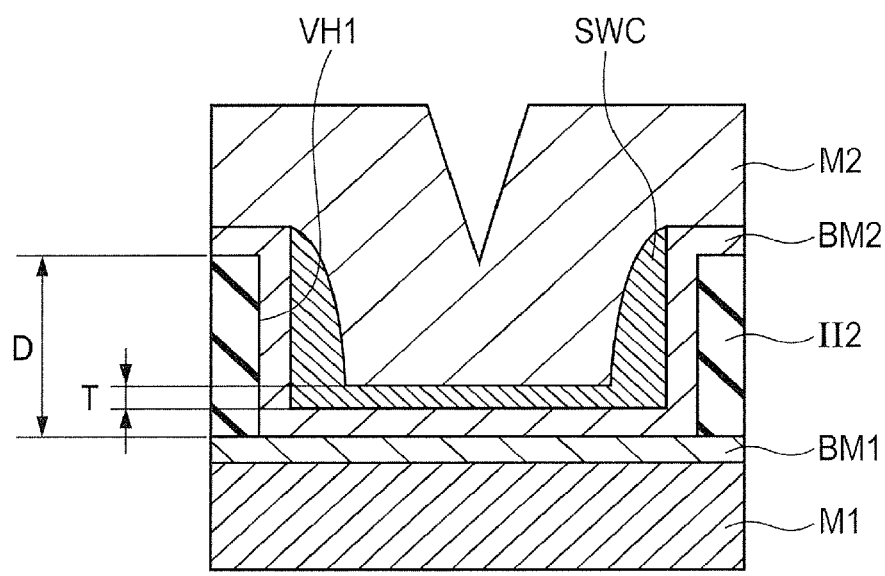
FIG. 14 is a schematic sectional diagram illustrating one configurational example of a semiconductor device according to a second embodiment.

As illustrated in FIG. 14, the configuration of the second embodiment is different from the configuration of the first embodiment in the configuration of the sidewall conductive layer SWC in the power element section. Specifically, the sidewall conductive layer SWC in the second embodiment covers the entire of the bottom wall surface of the via hole VH1. The sidewall conductive layer SWC covers the entire of the first barrier metal layer BM2 which is located on the bottom wall surface of the via hole VH1.

The sidewall conductive layer SWC includes a sidewall spacer shaped part and a thin film part. A thickness T of the thinnest part (the thin film part) of the sidewall conductive layer SWC is not more than ½ of a depth D of the via hole VH1. Incidentally, the sidewall spacer shaped part of the sidewall conductive layer SWC has a thickness which is almost the same as the depth D of the via hole VH1.

Incidentally, since the configuration of the second embodiment is almost the same as the configuration of the first embodiment in other respects, the same numerals are assigned to the same elements as those in the first embodiment and repetitive description thereof is not made.

Figure 15:
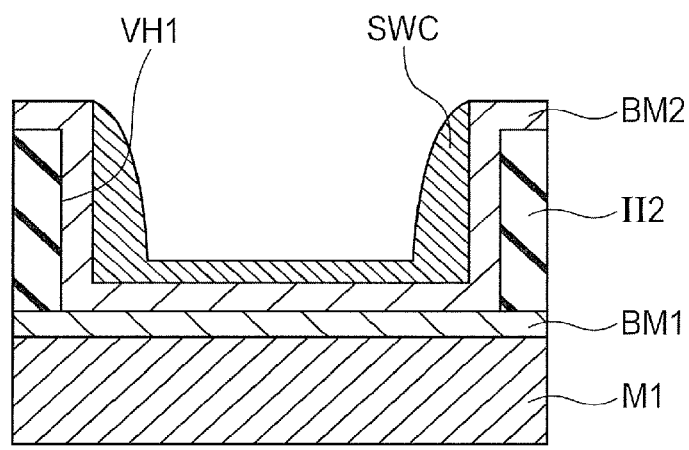
FIG. 15 is a schematic sectional diagram illustrating one example of a method of manufacturing the semiconductor device according to the second embodiment.

A manufacturing method in the second embodiment follows processes which are the same as the processes in the first embodiment illustrated in FIG. 6 to FIG. 8. Then, the entire surface of the conductive layer CL is etched back. In this case, as illustrated in FIG. 15, etching-back is terminated before the bottom wall surface of the via hole VH1 is exposed. Specifically, etching-back is controlled such that the second barrier metal layer BM2 is not exposed in the via hole VH1 in the power element section. Then, as illustrated in FIG. 14, the second metal wiring layer M2 is formed in the same manner as that in the first embodiment. From the foregoing, the semiconductor device according to the second embodiment is manufactured.

In the second embodiment, as illustrated in FIG. 14, the sidewall conductive layer SWC covers the entire of the bottom wall surface of the via hole VH1. Thereby, it becomes difficult for aluminum in the first metal wiring layer M1 to slip out to the second metal wiring layer M2 and thereby it becomes possible to suppress migration of aluminum.

In addition, the thickness T of the thinnest part of the sidewall conductive layer SWC is not more than ½ of the depth D of the via hole VH1. Accordingly, it is possible to suppress an increase in resistance while suppressing the migration of aluminum.

In addition, in the second embodiment, it is possible to obtain the same advantageous effect as that of the first embodiment.

Third Embodiment

Figure 16:
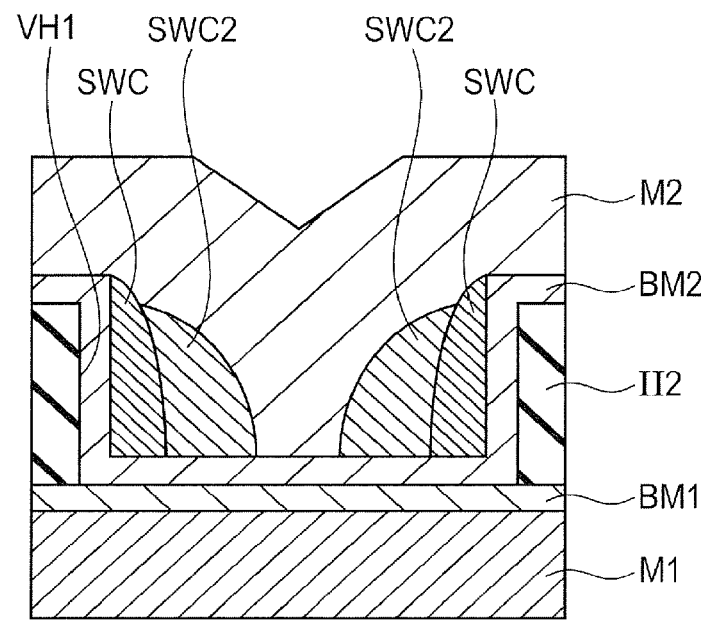
FIG. 16 is a schematic sectional diagram illustrating one configurational example of a semiconductor device according to a third embodiment.

As illustrated in FIG. 16, the configuration of the third embodiment is different from the configuration of the first embodiment in that another sidewall conductive layer SWC2 (a fourth conductive film) is formed in the via hole VH1 in the power element section. Specifically, the sidewall conductive layer SWC2 in the third embodiment has the sidewall space shape and is in contact with a side part of the sidewall conductive layer SWC.

Part of the first barrier metal BM2 is exposed from the sidewall conductive layer SWC and the sidewall conductive layer SWC2 on the bottom wall surface of the via hole VH1. The sidewall conductive layer SWC2 is made of the material which contains, for example, one or more kinds selected from the group including tungsten, titanium, titanium nitride, tantalum and molybdenum.

Incidentally, since the configuration of the third embodiment is almost the same as the configuration of the first embodiment in other respects, the same numerals are assigned to the same elements as those in the first embodiment and repetitive description thereof is not made.

Figure 17:
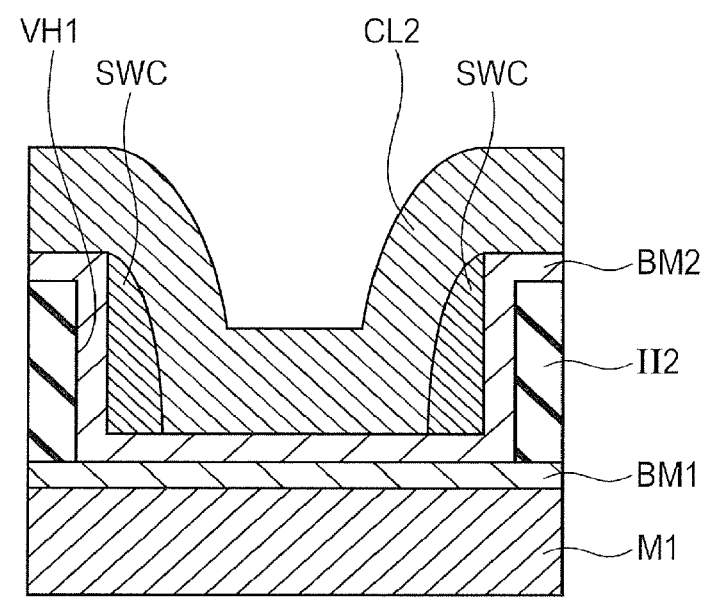
FIG. 17 is a schematic sectional diagram illustrating one example of a first process of a method of manufacturing the semiconductor device according to the third embodiment.

A manufacturing method in the third embodiment follows processes which are the same as the processes in the first embodiment illustrated in FIG. 6 to FIG. 8. Thereafter, as illustrated in FIG. 17, another conductive layer CL2 is formed on/over the second barrier metal layer BM2 and along the inner wall surface of the via hole VH1. The conductive layer CL2 is formed by, for example, depositing tungsten by the CVD method. In this case, in the power element section, the conductive layer CL2 is formed so as not to be tightly embedded in the via hole VH1.

Figure 18:
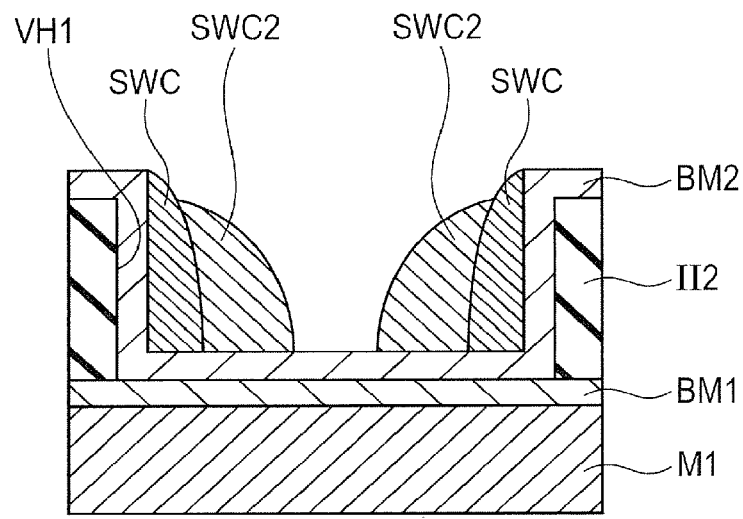
FIG. 18 is a schematic sectional diagram illustrating one example of a second process of the method of manufacturing the semiconductor device according to the third embodiment.

Then, as illustrated in FIG. 18, the entire surface of the conductive layer CL2 is etched back. In this case, etching-back is controlled such that the second barrier metal layer BM2 is not exposed in the via hole VH1 in the power element section. Then, as illustrated in FIG. 14, the second metal wiring layer M2 is formed in the same manner as that in the first embodiment. From the foregoing, a semiconductor device according to the third embodiment is manufactured.

In the third embodiment, the sidewall conductive layer SWC2 (the fourth conductive film) is formed in the via hole VH1 in the power element section. Therefore, the sidewall of the sidewall conductive layer SWC 2 is formed more gently than the sidewall of the sidewall conductive layer SWC. Thereby, the coatability of the second barrier metal layer BM2 which is formed in contact with the sidewall of the sidewall conductive layer SWC2 becomes more preferable.

In addition, in the third embodiment, it is possible to obtain the same advantageous effect as that in the first embodiment.

Figure 19:
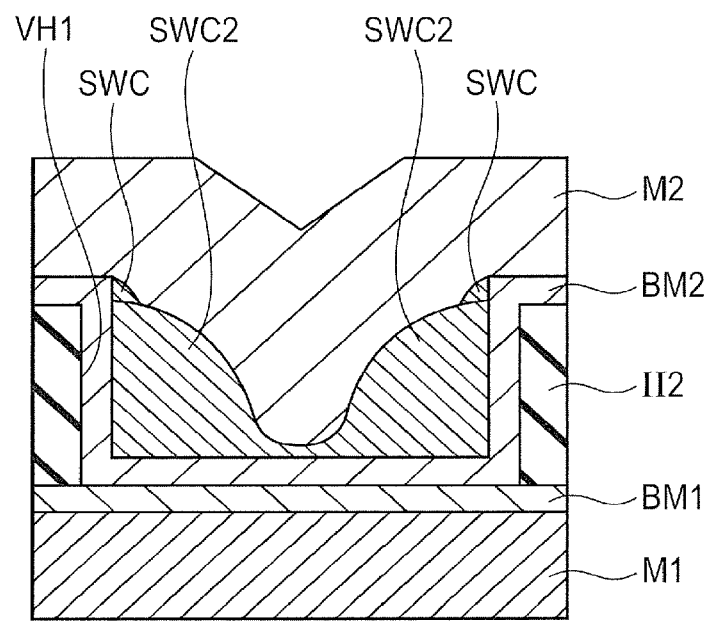
FIG. 19 is a schematic sectional diagram illustrating one configurational example of an altered example of the third embodiment.

Incidentally, as illustrated in FIG. 19, the sidewall conductive layer SWC2 may cover the entire of the bottom wall surface of the via hole VH1. That is, the sidewall conductive layer SWC 2 covers the entire of the second barrier metal layer BM2 which is located on the bottom wall surface of the via hole VH1.

The sidewall conductive layer SWC2 includes a sidewall spacer shaped part and a thin film part. A thickness of the thinnest part (the thin film part) of the sidewall conductive layer SWC2 is not more than ½ of the depth D of the via hole VH1. Incidentally, the sidewall spacer shaped part of the sidewall conductive layer SWC2 has a thickness which is almost the same as the depth D of the via hole VH1.

The configuration illustrated in FIG. 19 has both of the advantageous effect of the third embodiment and the advantageous effect of the second embodiment.

(Others)

Figure 20:
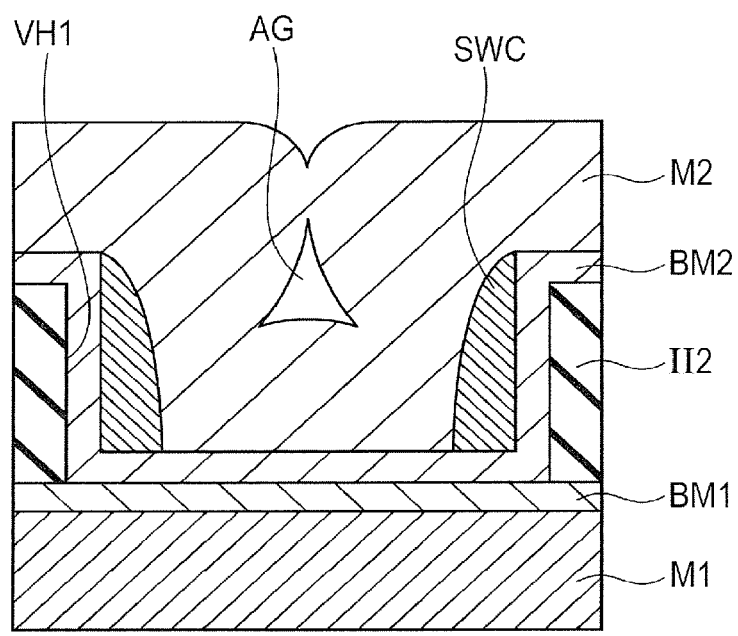
FIG. 20 is a schematic sectional diagram illustrating one example of a configuration that an air gap has been formed in a second metal wiring layer in the first embodiment.
Figure 21:
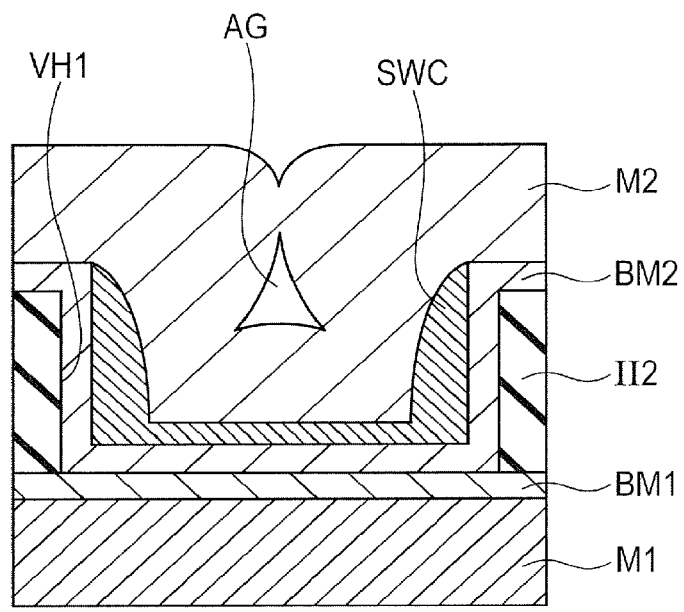
FIG. 21 is a schematic sectional diagram illustrating one example of a configuration that the air gap has been formed in the second metal wiring layer in the second embodiment.
Figure 22:
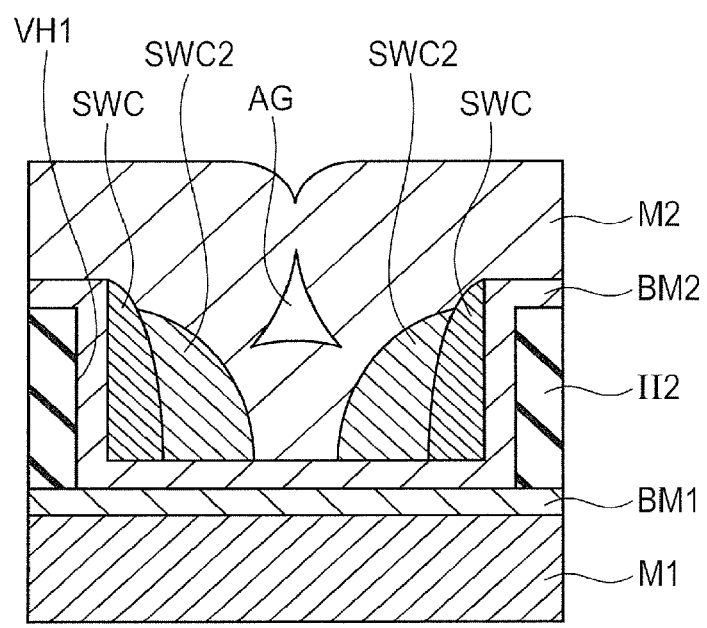
FIG. 22 is a schematic sectional diagram illustrating one example of a configuration that the air gap has been formed in the second metal wiring layer in the third embodiment.

In each of the configurations in the above-mentioned first to third embodiments, an air gap may be formed in the second metal wiring layer M2. FIG. 20 is a diagram illustrating one example of a state where an air gap AG has been formed in the second metal wiring layer M2 in the first embodiment. FIG. 21 is a diagram illustrating one example of a state where the air gap AG has been formed in the second metal wiring layer M2 in the second embodiment. FIG. 22 is a diagram illustrating one example of a state where the air gap AG has been formed in the second metal wiring layer M2 in the third embodiment. As illustrated in FIG. 20 to FIG. 22, the air gap AG is formed directly above the via hole VH1.

When the air gap is formed in the second metal wiring layer M2 as described above, since the dielectric constant of air in the air gap AG is stable, an inter-wiring capacitance is reduced and is stabilized.

Incidentally, although in the first to third embodiments, the power MOS transistor PTR has been described as the power element, an IGBT (Insulated Gate Bipolar Transistor) may be also used as the power element.

In addition, the power element in the first to third embodiments means an element for power conversion such as, for example, a power switch and so forth. Performances which are requested to the power element in each of the first to third embodiments in order to drive externally attached loads (a motor, a capacitor and so forth) are high-voltage resistance and large current handleability.

Figure 23:
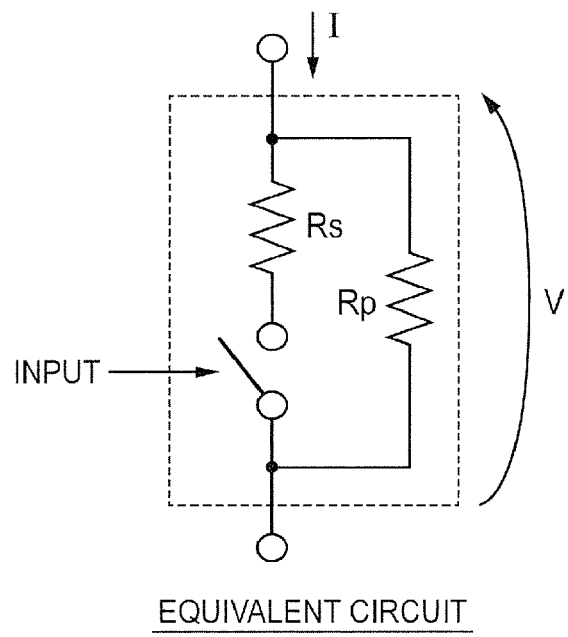
FIG. 23 is a diagram illustrating one example of an equivalent circuit of a power switch as one example of a power element.
Figure 24:
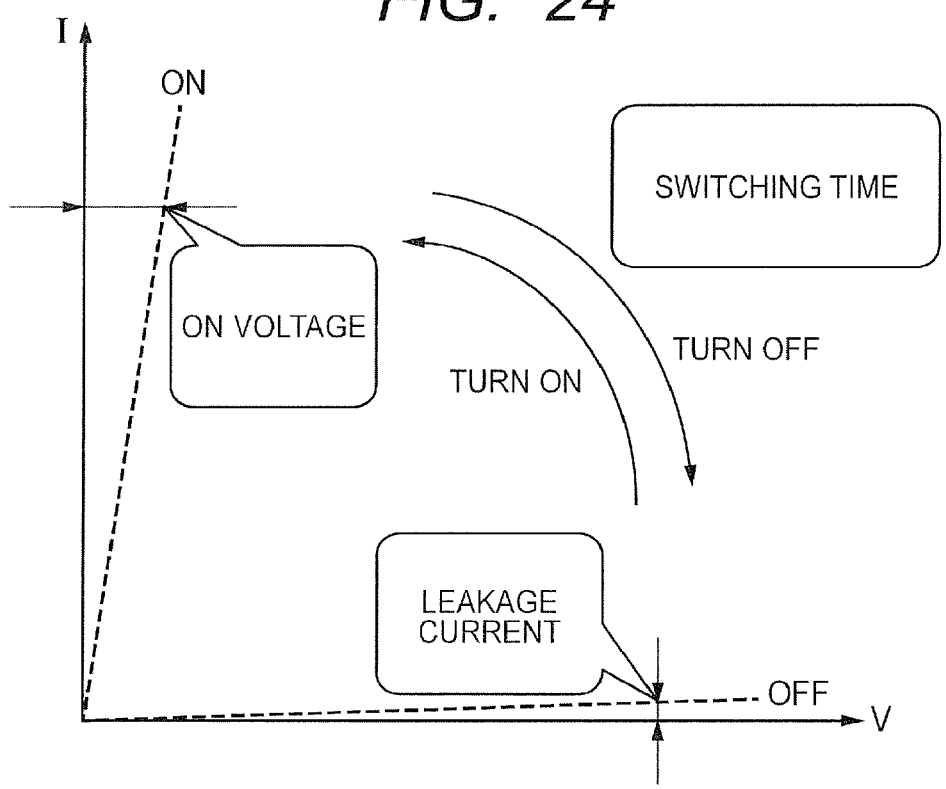
FIG. 24 is a diagram illustrating one example of an I-V characteristic of the power element.
Figure 25:
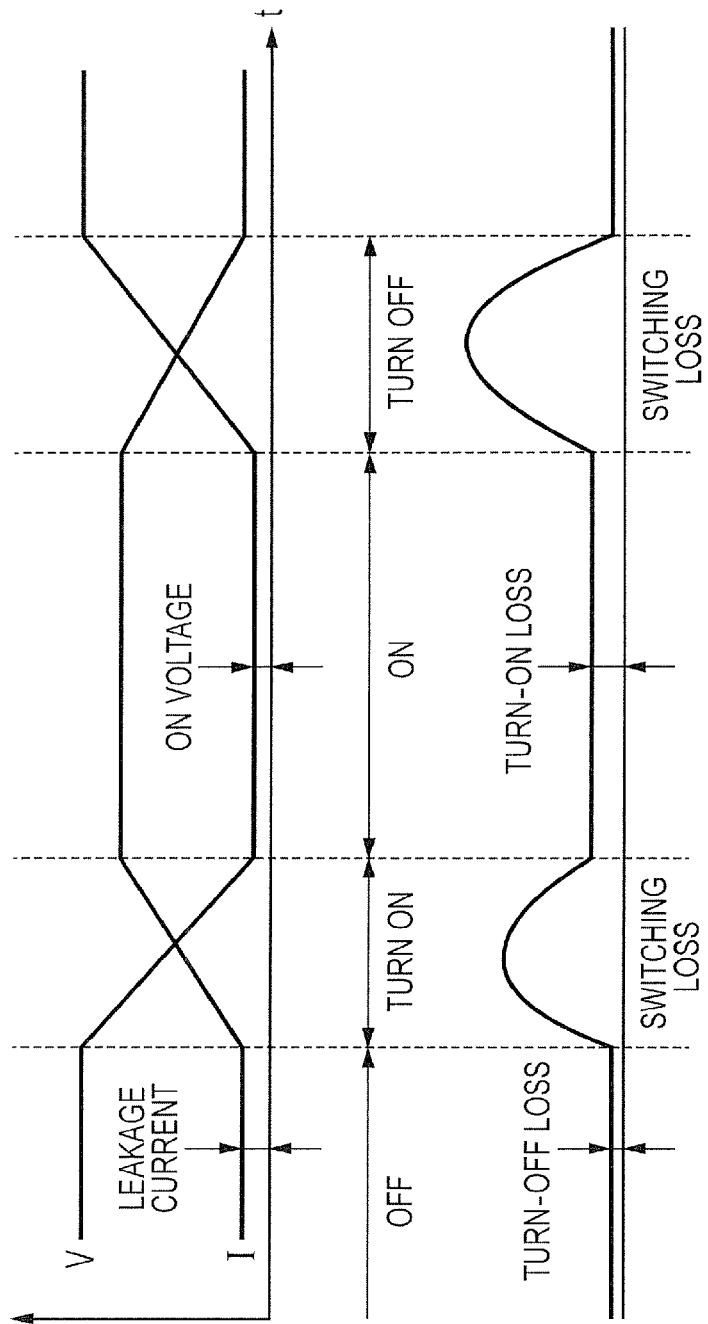
FIG. 25 is a diagram illustrating one example of an operational image of the power element.

The power element in each of the first to third embodiment has such an equivalent circuit as illustrated in, for example, FIG. 23, exhibits such an I-V characteristic as illustrated in, for example, FIG. 24 and performs such operations as illustrated in, for example, FIG. 25.

In addition, although in the first to third embodiments, the MOS transistor TR has been described as the logic element, a MIS (Metal Insulator Semiconductor) transistor may be also used as the logic element and the logic element is not limited thereto.

The logic element in each of the first to third embodiment means a digital signal processing element such as, for example, a switch of logical information and so forth. Performances which are requested as the logic element are, for example, low-voltage operability and high-speed switchability.

Although the invention which has been made by the inventors and others has been specifically described on the basis of the embodiments thereof as mentioned above, it goes without saying that the present invention is not limited to the above-mentioned embodiments and may be altered and modified in a variety of ways within a range not deviating from the gist of the present invention.

What is claimed is:

1. A semiconductor device comprising:
   a semiconductor substrate having a first region in which a first MOS transistor is formed and a second region in which a second MOS transistor is formed, the first MOS transistor and the second MOS transistor being different from each other;
   a first insulating film formed on the semiconductor substrate;
   a first wiring formed on the first insulating film formed on the semiconductor substrate in the first region;
   a second wiring formed on the first insulating film formed on the semiconductor substrate in the second region;
   a first barrier metal film formed on the first wiring;
   a second barrier metal film formed on the second wiring;
   a second insulating film formed on the first insulating film, and having a first hole located in the first region and a second hole located in the second region;
   a third barrier metal film formed on an inner sidewall surface of the first hole;
   a fourth barrier metal film formed on an inner sidewall surface of the second hole;
   a first conductive film formed on the inner sidewall surface of the first hole via the third barrier metal film;
   a second conductive film formed on the inner sidewall surface of the first hole via the first conductive film such that an internal air gap is formed within the second conductive film;
   a third conductive film embedded in a space formed by the fourth barrier metal film in the second hole; and
   a fourth conductive film formed on the third conductive film,
   wherein, in cross-section view, a part of the air gap is located in the first hole.

2. The semiconductor device according to claim 1,
   wherein the first MOS transistor is a power MOS transistor,
   wherein the second MOS transistor is a MOS transistor, and
   wherein a current value to be supplied to the first MOS transistor through the second conductive film is higher than a current value to be supplied to the second MOS transistor through the fourth conductive film.

3. The semiconductor device according to claim 1,
   wherein the third barrier metal film is formed on each of the inner sidewall surface of the first hole and a surface of the first barrier metal film exposed to the first hole, and
   wherein the fourth barrier metal film is formed on each of the inner sidewall surface of the second hole and a surface of the second barrier metal film exposed to the second hole.

4. The semiconductor device according to claim 3,
   wherein the first conductive film is formed on the inner sidewall surface of the first hole via the third barrier metal film and on the exposed surface of the first barrier metal film via the third barrier metal film.

5. The semiconductor device according to claim 4,
   wherein the second conductive film is formed on the first conductive film.

6. The semiconductor device according to claim 3,
   wherein the second conductive film is formed on the inner sidewall surface of the first hole via the first conductive film and on a surface of the third barrier metal film exposed from the first conductive film.

7. The semiconductor device according to claim 1,
   wherein the first conductive film is formed on the inner sidewall surface of the first hole via the third barrier metal film so as not to extend laterally outside the first hole.

8. The semiconductor device according to claim 1,
   wherein the first conductive film is formed such that a diameter defined by an inner surface of the first conductive film continuously increases as going upward in cross-section view.

9. The semiconductor device according to claim 1,
   wherein each of the third barrier metal film and the fourth barrier metal film is made of one or more of titanium and titanium nitride,
   wherein each of the first conductive film and the third conductive film contains one or more of tungsten, titanium, titanium nitride, tantalum and molybdenum, and
   wherein each of the second conductive film and the fourth conductive film is made of aluminum.

10. The semiconductor device according to claim 1,
    wherein the third conductive film is embedded in a space formed by the fourth barrier metal film in the second hole such that any gap is not formed within the third conductive film.

11. The semiconductor device according to claim 1,
    wherein, in cross-sectional view, a width of the first hole is wider than a width of the second hole.

* * * * *